United States Patent [19]

Trilling

[11] Patent Number: 4,471,323
[45] Date of Patent: Sep. 11, 1984

[54] PROTECTION CIRCUITS FOR COMPLEMENTARY DIRECT-COUPLED AMPLIFIERS

[76] Inventor: Ted R. Trilling, 3152 Berkshire Rd., Doylestown, Pa. 18974

[21] Appl. No.: 323,012

[22] Filed: Nov. 19, 1981

[51] Int. Cl.³ .......................... H03F 3/26; H03F 17/00
[52] U.S. Cl. .................................... 330/268; 330/298; 330/59
[58] Field of Search ............... 330/59, 207 P, 262, 330/263, 267, 268, 295, 298, 296

[56] References Cited

U.S. PATENT DOCUMENTS

| | | | |
|---|---|---|---|
| 3,315,176 | 4/1967 | Biard | 330/287 |
| 3,914,703 | 10/1975 | Stauffer | 330/268 |
| 3,925,709 | 12/1975 | Mitchell et al. | 307/311 |
| 4,121,168 | 10/1978 | Stitt | 330/59 |
| 4,206,415 | 6/1980 | Boudouris et al. | 330/59 |

Primary Examiner—James B. Mullins
Assistant Examiner—G. Wan
Attorney, Agent, or Firm—Robert F. Beers; Henry Hansen

[57] ABSTRACT

An electronic circuit provides short circuit protection and idle current control for a direct-coupled power amplifier.

For short circuit protection, a voltage proportional to output current is monitored and is fed to a light emitting diode (LED). Light energy emitted from the LED as a function of output current is optically coupled to a phototransistor which steals drive current from the input transistor of the output amplifier hence turning off the output transistor.

For automatic idling current control, the idle current of a complementary output transistor pair is sampled by operational amplifiers each having an inhibit gate connected from the output of a respective comparator. The comparator produces an inhibit output when the output transistor pair is providing load current to the load. When the pair is not providing load current, the amplifier amplifies the idling current from the pair and provides it to an LED. The LED emits light energy as a function of idle current to a phototransistor which is optically coupled to receive the light and regulate the idle current as a function thereof.

10 Claims, 4 Drawing Figures

PROTECTION CIRCUITS FOR COMPLEMENTARY DIRECT-COUPLED AMPLIFIERS

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

This invention relates generally to complementary direct-coupled amplifiers and in particular to short circuit protection and idle current control for direct-coupled amplifiers.

Full complementary direct-coupled audio amplifiers are capable of delivering power into a load with little distortion. The output power is normally provided by complementary pairs of a class B amplifier with each pair conducting for half of a cycle. To minimize cross-over distortion as the output signal polarity changes, a bias or idle current is made to flow through the output transistor circuitry. This current is normally set by the band-gap voltage drops of diodes and transistor junctions forcing the idle current to flow. Since the band-gap of all junctions are temperature dependent and since the output transistors heat up during operation, the voltage across their junctions cause the idle current to increase and cross-over distortion to increase. When the output current increases, transistor junction temperature increases even more, the effect becomes cumulative and idle current reaches the point where without current limiting output transistors are damaged.

Additionally, amplifier output loads such as a speaker can change impedance or at times short out forcing high current to flow through the output transistors causing them to become damaged. This potential problem is normally prevented by providing short circuit protection such as shown in the complementary direct-coupled amplifier circuit of Application Note No. AN-485 of Motorola Semiconductor Products Inc., Phoenix, Ariz.; printed in U.S. 6-69. The circuit however, requires a large number of parts and forms a secondary feedback loop within the amplfier which tends to cause instability problems unless extreme care is used in the circuitry layout.

In U.S. Pat. No. 3,925,709, another circuit is found which provides over-current protection by utilization of a light emitting diode and a photodiode within an optical isolator. This structure, however, does not direct itself to the draining of current by the photo detector but only provides for actuation of a current regulating system responsive to the light emitting diode actuation.

The use of active feedback to improve differential amplifier performance featuring both hard wire and optical coupling is disclosed in inventor's previous U.S. Pat. No. 3,995,149. The patent, however, does not disclose where the optical devices must be connected in a complementary direct-coupled amplifier for providing short circuit and current limiting.

SUMMARY OF THE INVENTION

Accordingly, it is an object of the present invention to provide simple and effective short circuit protection of complementary direct-coupled power amplifiers. Another object of this invention is to provide novel current limiting and idle current control for the complementary direct-coupled power amplifier. Yet another object of this invention is to reduce the number of parts required to provide short circuit protection and idle current control for a complementary direct-coupled amplifier. Still another object of the invention is to provide short circuit protection and idle current control utilizing feedback loops which do not adversely affect amplifier stability. It is another object to provide short circuit protection and idle current control for a complimentary direct-coupled amplifier which does not require extreme care in the lay out of circuitry.

Briefly, these and other objects are accomplished in the following manner. For short circuit protection a voltage monitored from an output transistor stage of a complementary direct-coupled amplifier is connected to a light emitting diode which optically couples light to a phototransistor. When the phototransistor as a result of the coupled light conducts, it steals drive current from the direct-coupled amplifier input transistor causing the output transistor to turn off.

In a first embodiment for idle current control, the output current of the complementary direct-coupled amplifier output transistor stages are monitored by two operational amplifiers each having an inhibit gate connected from a respective comparator. The comparators are connected to the direct-coupled amplifier and provide an inhibit output to each of the respective operational amplifiers when the direct-coupled output voltage to its load goes positive. When the output voltage to the direct-coupled amplifier is negative, no inhibit is generated indicating only idle current is flowing in the output circuit. During this period, the current is amplified by the uninhibited operational amplifier and fed to a light emitting diode which as a function of idle current emits light sufficient to turn on a phototransistor which steals current from the direct-coupled amplifier input transistor collector diode array. The resulting decrease in current through the diode array causes the voltage across it to drop causing the direct-coupled amplifier idle current to decrease.

In a second embodiment for idle current control, a voltage developed by the flow of idle current in the direct-coupled amplifier is amplified and switched as a function of output voltage polarity to the junction of a constant current source and two series light emitting diodes. Current from the source which would normally flow through the diodes is stolen by the operational amplifier switched into the junction causing light from the diodes to decrease and photodiodes in the collectors of the input transistors of the direct-coupled amplifier to have less of a voltage drop across them causing a reduction of the idle current.

For a better understanding of these and other aspects of the invention, reference may be made to the following detailed description taken in conjunction with the accompanying drawings.

DESCRIPTION OF THE PREFERRED EMBODIMENTS

Figures 1, 4:
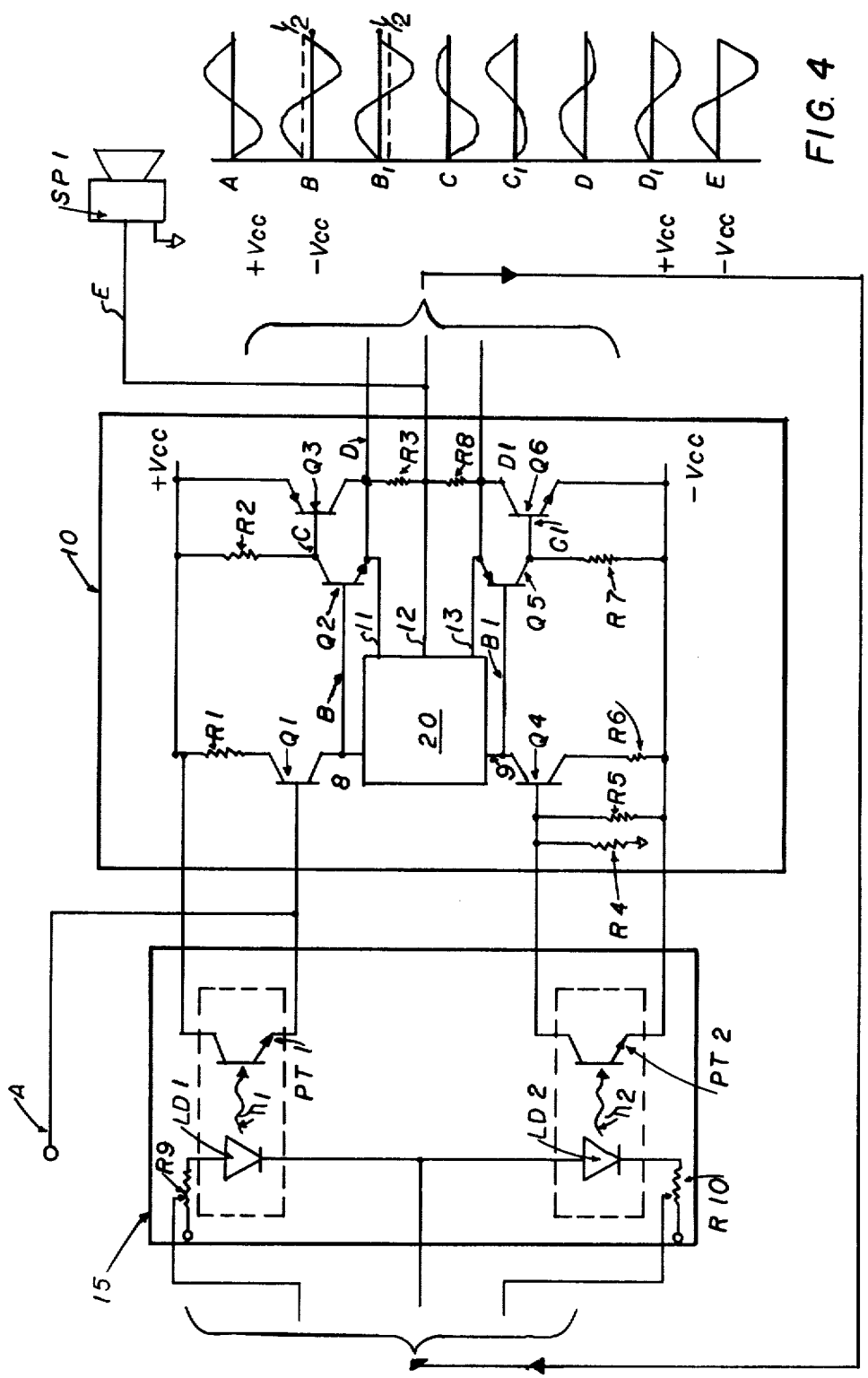
FIG. 1 is a circuit diagram of a complementary direct-coupled power amplifier having short circuit protection and idle current control according to the invention.
FIG. 4 is a set of waveforms useful in understanding the operation of the invention.

Referring now to FIG. 1, there is illustrated a complementary direct-coupled amplifier 10 having a short circuit protection 15 and an idle current control 20. An input signal A, consisting of a sinewave in the audio range only for demonstrative purposes, is connected to the base of an input transistor Q1. A signal B, consisting of signal A amplified and phase shifted by transistor Q1 and having a positive DC bias is provided from the collector thereof. The emitter of transistor Q1 is connected to +Vcc through emitter biasing resistor R1. The collector transistor Q1 is connected through wire 8 to current control 20 and the base of a transistor Q2. Transistor Q2 is connected to receive signal B on the base thereof, phase shift and amplify the negative half cycle and provide a signal C therefrom. The emitter of transistor Q2 is connected through wire 11 to idle current control 20 and short circuit protection 15, the common connection of the collector of a transistor Q3 and an output current monitoring resistor R3. The base of transistor Q3 is connected to receive signal C and to −Vcc through base bias resistor R2. Transistors Q2 and Q3 form a compound pair which function as emitter follower with high current gain and unity voltage gain for providing a signal D consisting of signal C phase shifted. Signal D develops a voltage across monitoring resistor R3 proportional to the collector current of transistor Q3.

A transistor Q4 has its collector connected through wire 9 to idle current control 20 and serves as a constant-current source for the DC bias current which flows through wire 9, control 20, wire 8 and transistor Q1. Additionally, transistor Q4 provides AC current drive signal B1, which is similar to signal B but has a negative DC bias, during negative peak excursions of input sgnal A. Bias resistors R4 and R5 form a voltage divider from −Vcc to ground with the base of transistor Q4 connected to the common connection of resistors R4 and R5. Emitter bias resistor R6 is connected from the emitter of transistor Q4 to −Vcc.

The base of transistor Q5 is connected to receive signal B1 and to provide signal C1 from its collector to the base of transistor Q6. Signal C1 is similar to signal C but has its negative half-cycle clipped and positive half amplified. Biasing resistor R7 is connected from −Vcc to the common connection of the collector of transistor Q5 and the base of transistor Q6. The emitter of transistor Q5 is connected to the common connection of the collector of transistor Q6, through wire 13 to idle current control 20 and short circuit protection 15 and output current monitoring resistor R8. Transistors Q5 and Q6 form a compound pair and similarly function as Q2 and Q3 during the negative portion of input signal A. Output current monitoring resistors R3 and R8 are commonly connected together by wire 12 to current control 20 short circuit protection 15 and a speaker SP1. Signal D1, similar to signal D but having its negative half cycle amplified and its positive half clipped, is provided from the collector of transistor Q6 and develops a voltage across monitoring resistor R8 proportional to the collector current of transistor Q6.

Signals D and D1 are combined to produce at the common connection of output current monitoring resistors R3 and R8 and speaker SP1 a signal E having the same waveshape as signal A but being phase shifted and having greater current capacity. Signal E is the output signal of amplifier 10 and is used to drive speaker SP1.

Wires 11, 12 and 13 connect the voltage developed across monitoring resistors R3 and R8 of complementary direct-coupled amplifier 10 respectively to the adjustable arm of variable current limiting resistor R9, the common connection of the cathode of a light-emitting diode LD1 and anode of a light emitting diode LD2, and the adjustable arm of a variable current limiting resistor R10. Resistor R9 and R10 are adjusted so that under normal operating conditions with maximum output current flowing to speaker SP1, light emitting diodes LD1 and LD2 do not emit sufficient light λ1 and λ2 to actuate phototransistors PT1 and PT2 respectively. As the voltage across monitoring resistors R3 and R8 increases it exceeds the band-gapvoltage for light emitting diodes LD1 and LD2 and turns them on. Phototransistors PT1 and PT2 are optically connected to receive light energies λ1 and λ2 from light emitting diodes LD1 and LD2 respectively. The emitter of phototransistor PT1 is connected to the base of transistor Q1 and the collector is connected to +Vcc. The emitter of phototransistor PT2 is connected to −Vcc and the collector is connected to the base of transistor Q4. Phototransistors PT1 and PT2 when actuated into conduction steal input base current from the complementary direct-coupled amplifier input transistors Q1 and Q4 and hence limit the power dissipated in output transistor pairs Q2-Q3 and Q5-Q6 respectively.

Figure 2:
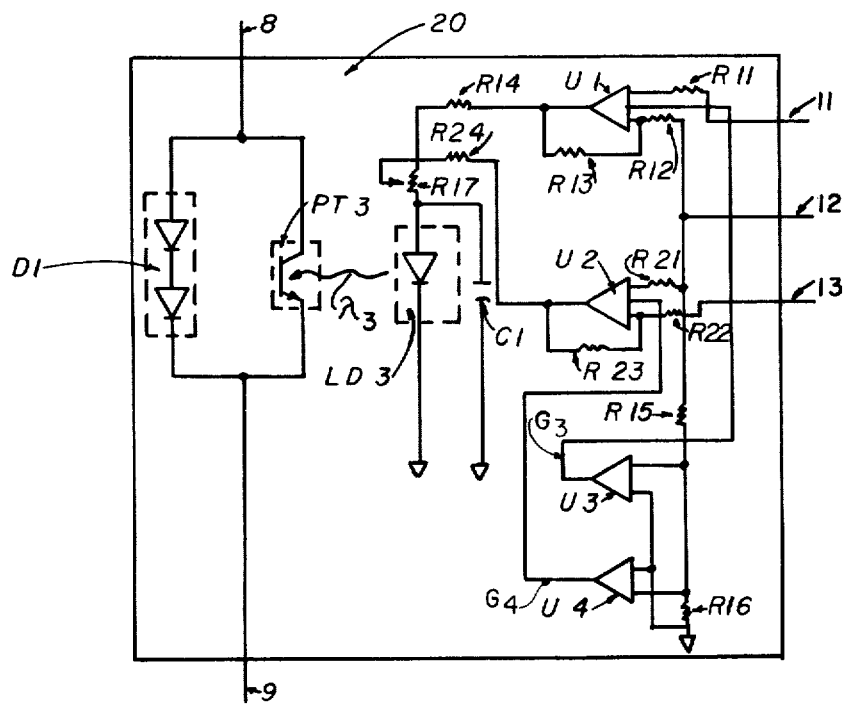
FIG. 2 illustrates with more detail a first embodiment of the idle current control circuit for the complementary direct-coupled power amplifier of FIG. 1.

FIG. 2 illustrates with more detail a first embodiment of idle current control 20 of FIG. 1. Wire 11 is connected from the emitter of Q2 through an offset voltage setting input resistor R11 to the noninverting (+) input of operational amplifier U1. Wire 12 is connected through a gain setting resistor R12 to the common connection of a feedbck resistor R13 and the inverting (−) input of amplifier U1.

Wire 12 is also connected through an offset voltage setting resistor R21 to the noninverting (+) input of an amplifier U2; and a wire 13 is connected through a gain setting input resistor R22 to the common connection of a feedback resistor R23 and the inverting (+) input of amplifier U2. Resistors R11, R12, R13 and R21, R22, R23 are selected to provide offset voltage and gain settings for amplifiers U1 and U2, respectively.

Wire 12 is also connected through series-connected, voltage dividing resistors R15 and R16 to ground and provide an input signal at their junction to the inverting (−) and non-inverting (+) inputs of comparators U3 and U4 respectively. The noninverting (+) and inverting (−) inputs of U3 and U4 respectively are connected to ground. The comparators U3 and U4 outputs are connected respectively to the inhibit inputs of amplifiers U1 and U2. Thus, when the signal on wire 12 is positive, amplifier U1 is inhibited and U2 will amplify the idle current on wire 13. Similarly, amplifier U1 will amplify the idle current on wire 11 when wire 12 is negative. The output of U1 is connected through current limiting resistors R14 and R17 to the common connection of the anode of a light emitting diode LD3 and capacitor C1. The cathode of light emitting diode LD3 and the other end of capacitor C1 are connected to ground. Capacitor C1 filters out any switching spikes that occur during transition from one half-cycle to the other. The output of amplifier U2 is connected through a current limiting resistor R24 to an adjustable tap on resistor R17. The position of the tap is adjusted to balance the amplified idle currents from the outputs of amplifiers U1 and U2 fed to light emitting diode LD3.

A diode assembly D1 consisting of two series-connected diodes in parallel with a phototransistor PT3 is connected at its anode end to a wire 8 and at its cathode end to wire 9. The collector and emitter of phototransistor PT3 are connected to the anode and cathode ends respectively, and is optically connected to light emitting diode LD3. The output current of the compound transistor pair Q2 and Q3 (FIG. 1) is monitored by monitoring resistor R3 and fed through wires 11 and 12 to the combination of resistors R11, R12, and amplifier U1. Amplifier U1 is inhibited by inhibit gate signal G3 from comparator U3 which produces an input pulse whenever the output signal E to speaker SP1 goes positive indicating that output current is flowing through resistor R3. When signal E is negative, the current through resistor R3 is solely idle current and U1 amplifies the idle current providing current through resistors R14, R17 and light emitting diode LD3. When the idle current exceeds a predetermined threshold level, diode LD3 turns on and light energy λ3 is emitted to phototransistor PT3. When phototransistor PT3 turns on it steals some of the current from diode assembly D1 causing the voltage across it to drop and the idle current to decline. In a similar fashion, the output current of the compound transistor pair Q5 and Q6 is monitored by monitoring resistor R8 and fed through wires 13 and 12 to the combination of resistors R22, R21 and amplifier U2. Amplifier U2 is inhibited by inhibit gate signal G4 from comparator U4 whenever the output signal E to speaker SP1 goes negative. When signal E is positive, the current through resistor R8 is solely idle current and U2 amplifies and provides the current through resistors R24, R17 and diode LD3. Thus the idle current is monitored and regulated during both positive and negative half cycles from the side of the complementary amplifier that is not delivering current to the load.

Figure 3:
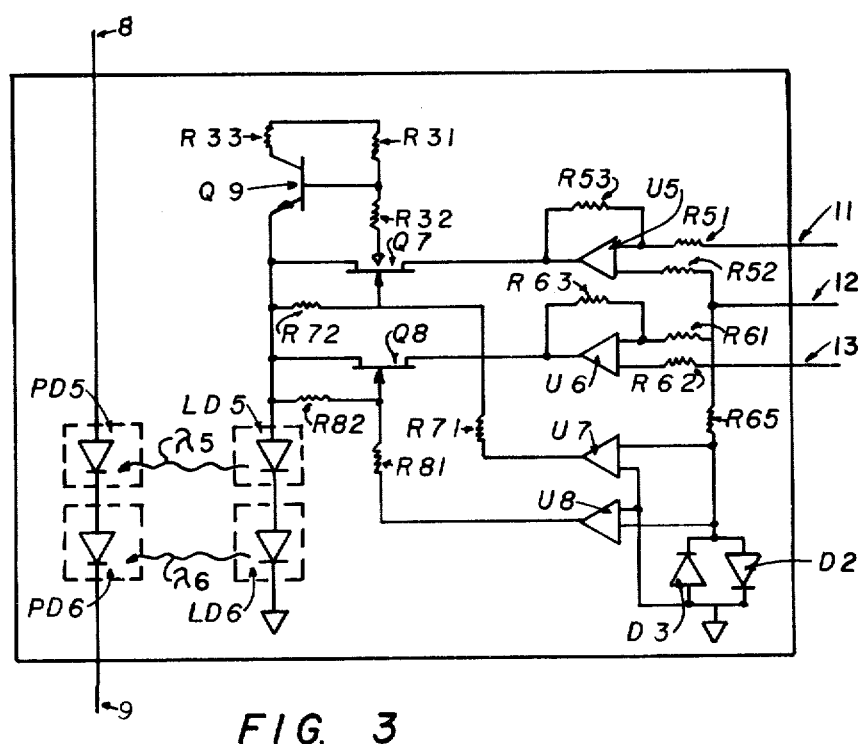
FIG. 3 is a second embodiment of the idle current control circuit of FIG. 2.

FIG. 3 illustrates with more detail a second embodiment of idle current control 20 of FIG. 1. Wire 11 is connected from monitoring resistor R3 (FIG. 1) to a gain setting input resistor R51 in series with the inverting (−) input of an operational amplifier U5. A feedback resistor R53 is connected from the junction of resistor R51 and the inverting (−) input of amplifier U5 to the junction of amplifier U5 and the source of a field effect transistor Q7, connected as an analog switch. Wire 12 is connected through the offset voltage setting input resistor R52 to the noninverting (−) input of amplifier U5. Wire 12 is also connected through gain setting input resistor R61 to the inverting (−) input of operational amplifier U6. A feedback resistor R63 is connected from the inverting input of amplifier U6 to the common connection of the source of field effect transistor Q8, connected as an analog switch, and the output of amplifier U6. Wire 13 is connected to the noninverting (+) input of amplifier U6 through offset voltage setting input resistor R62. Amlifiers U5 and U6 provide amplification of the voltage of signals D and D1 monitored across resistors R3 and R8 respectively. Transistors Q7 and Q8 pass the amplified voltage level from amplifiers U5 and U6 respectively only during the period when signal E or wire 12, goes negative in the case of amplifier U5 since that is when only idle current flows through resistor R3 and goes positive in the case of amplifier U6 since that is when only idle current flows through resistor R8. Resistors R51, R52, R53 and R61, R62, R63 provide offset voltage and gain setting respectively for amplifiers U5 and U6. Wire 12 is also connected through voltage dividing resistor R65 to the common connection of the inverting (−) input of a comparator U7, the noninverting (−) input of a comparator U8, and the parallel combination of diode D2 and diode D3. The cathode of diode D2 and the anode of diode D3 are connected to ground, the common connection of the inverting (+) input of comparator U7 and the inverting input (−) of comparator U8. A signal G7 from comparator U7 consisting of an inhibit pulse is connected to the gate of transistor Q7 from the junction of a voltage divider formed by resistors R71 and R72 connected between the output of comparator U7 and the common connection of the drain of transistor Q7, emitter of transistor Q9 and the anode of light emitting diode LD5. Signal G7 prevents transistor Q7 from passing the output of amplifier U5. A signal G8 from comparator U8 is connected to the gate of transistor Q8 from the junction of a voltage divider formed by resistors R81 and R82 connected between the output of comparator U8 and the common connection of the drain of transistor Q8, emitter of transistor Q9 and anode of light emitting diode LD5. Signal G8 prevents transistor Q8 from passing the output of amplifier U6. A transistor Q9, collector resistor R33 and voltage divider base biasing resistors R31 and R32 form a constant current source which supplies current to illuminate light emitting diodes LD5 and LD6. The emitter of transistor Q9 is connected to the drains of transistors Q7 and Q8, resistors R72 and R82 and the anode of LD5. Light emitting diodes LD5 and 6 are in series, the cathode of diode LD5 being connected to the anode of diode LD6 and cathode of diode LD6 being connected to ground. As a result of current flow from transistor Q9 through LD5 and 6, light energy λ5 and λ6 is emitted and optically coupled to photodiodes PD5 and 6 respectively. Photodiode PD5 has its anode connected to wire 8 and its cathode connected to the anode of photodiode PD6 which has its cathode connected to wire 9. Transistor Q9 provides the required current to diodes LD5 and LD6 causing them to emit sufficient light energy to bias diodes PD5 and PD6 respectively to obtain the proper idle current in compound transistor pairs Q2, Q3 and Q5, Q6. When the idle current increases above a predetermined level amplifiers U5 and U6 will in syncronism with the proper portion of the cycle steal current from light emitting diodes LD5 and LD6 decreasing their emitted light intensity. The reception of less light by photodiodes PD5 and PD6 will cause a decrease in the voltage drop across them and hence decrease the idle current in the complementary direct-coupled amplifier. Similarly if the idle current decreases too low, the monitor amplifiers U5 and U6 will steal less current from light emitting diodes LD 5 and 6 causing their light intensity to increase thus increasing the voltage across photodiodes PD 5 and 6 and increasing the idle current.

Operation of the protection circuits for complementary direct-coupled amplifiers is now summarized with reference to FIGS. 1-4. A signal A, comprising a sine wave for illustrative purposes is connected to the input of a complementary direct-coupled amplifier 10 which at its output provides a signal E having a waveshape similar to input signal A but having sufficient power to drive a load speaker SP1. Connected to the output of amplifier 10 are two electro-optic circuits 15 and 20 each of which monitor current to allow amplifier 10 to operate safely under usable load conditions including a short. The electro-optics of circuits 15 and 20 include light emitting diodes, phototransistors and photodiodes in a closed noninteracting feedback loop.

In the case of short circuit protection phototransistors PT1 and PT2 optically connected to receive light from LD1 and LD2 respectively and regulate the input bias circuit to prevent the output circuit of amplifier 10 from reaching current overload. Additionally there are two embodiments of the invention for providing idle current control. In the first embodiment idle current from compound transistor pairs Q2, Q3 and Q5, Q6 is monitored, amplified by either amplifier U1 or U2 and gated to flow through light emitting diode LD3 by comparators U3 or U4. When the idle current exceeds a predetermined level, light emitting diode LD3 emits light energy λ3 to phototransistor PT3 which steals current from diode array D1. Loss of current through array D1 decreases the voltage drop across it causing the reduction if idle current.

A second embodiment of idle current control 20 operates as follows. Idle current flow produces a voltage across monitoring resistors R3 and R8 of amplifier 10. The voltage is amplified by U1 and U2 and connected to the junction of constant current generator transistor Q9 and series light emitting diodes LD5 and LD6 through analog switches transistors Q7 and Q8. Resistor R65, diodes D2 and D3, and comparators U7 and U8 sense the direction of current flow through speaker SP1. Depending on the direction of flow Q7 or Q8 allows amplifier U5 or U6 to steal current from the light emitting diodes LD5 and 6. When the current is reduced sufficiently, the light intensity of diodes LD5 and 6 decreases causing the voltage across photodiodes PD5 and PD6 to decrease and in turn forcing the idle current to subside.

Therefore, some of the many advantages of the present invention should now be apparent. In summary, the use of short circuit protection and idle current control for a complementary direct-coupled amplifier improves its stability, reliability and preformance. Short circuit protection and idle current control is achieved with simple and effective electro-optic circuits having a reduced number of parts compared with solely electronic component circuits. Additionally, the electro-optic feedback loops are non-interactive with circuit gain hence amplifier stability is not sacrificed to achieve short circuit protection and idle current control. Obviously, many modifications and variations of the present invention are possible in the light of the above teachings. It is therefore to be understood that, within the scope of the appended claims, the invention may be practiced otherwise than as specifically described.

What is claimed is:

1. An amplifier for an audio input signal, comprising:
   first input stage means for amplifying the positive half cycle of the input signal;
   second input stage means complementary to said first input stage means for amplifying the negative half cycle of the input signal;
   output stage means directly coupled to said first and second input stage means for supplying an output current based on the combined amplified half cycles;
   current generating means for providing idling current to said output stage means to minimize cross-over distortion;
   first electro-optic feedback means connected between said output stage means and said first and second input stage means for limiting the output current to prevent overloading; and
   second electro-optic feedback means connected in a closed loop between said output stage means and said current generating means for controlling the idling current substantially about a predetermined optimal level.

2. An audio amplifier according to claim 1, wherein said first electro-optic feedback means comprises:
   sensing means connected to monitor the output current of said output stage means for producing light energy proportional thereto; and
   photoconductor means optically adapted to receive the light energy from said sensing means and electrically connected to said first and second input stage means for automatically adjusting the amplifier input bias as a function of energy level to prevent the output current from reaching current overload.

3. An audio amplifier according to claim 1, wherein said second electro-optic feedback means comprises:
   comparator means connected to said output stage means for determining which half of the amplification cycle is occurring and for providing an inhibit signal indicative of output current flow;
   gated amplifier means connected to amplify the idle current and to prevent amplification simultaneously with the receiving of the inhibit signal;
   light source means connected to receive the amplified idle current from said amplifier means and provide light energy proportional thereto; and
   light receptor means optically connected to receive the light energy from said light source means and for automatically increasing or decreasing the idle current as a function of energy level.

4. An audio amplifier according to claim 1, wherein said second electro-optic feedback means comprises:
   amplifier means connected to monitor the idle current within said output stage means and to provide a low impedance path on the output thereof;
   comparator means connected to said output stage means for determining which half of the amplification cycle is occurring and providing a gating signal indicative thereof;
   switching means connected to said amplifier means and said comparator means for receiving said gating signal and diverting current therethrough;
   light source means connected to said switching means for producing and emitting light energy as a function of current flow therethrough;
   a current source connected to said switching means and said light source means for providing current therefrom; and
   light receptor means optically connected to receive the light energy from the source means and for automatically increasing or decreasing the idle current as a function of energy level.

5. An improved complementary direct-coupled amplifier of the type wherein a positive half of an input signal is amplified by a first set of component parts and negative half of the input signal is amplified by a second set of similar component parts, both amplified halves being combined and connected to supply an output current and wherein a generating circuit provides an idling current to prevent distortion from arising during the interval between the positive and negative amplification cycles, wherein the improvement comprises in combination therewith:

comparator means connected to the output of the amplifier for determining which half of the amplification cycle is occurring and for providing an inhibit signal indicative of output current flow;

gated amplifier means connected to amplify the idle current and to prevent amplification simultaneously with the receiving of the inhibit signal;

light source means connected to receive the amplified idle current from the gated amplifier means and provide light energy proportional thereto; and light receptor means optically connected to receive the light energy from the source means and further connected to the generator circuit thus forming a closed loop therebetween for automatically increasing or decreasing the idle current as a function of energy level.

6. An improved complementary direct-coupled amplifier of the type wherein a positive half of an input signal is amplified by a first set of component parts and a negative half of the input signal is amplified by a second set of similar component parts, both amplified halves being combined and connected to supply an output current and wherein a generating circuit provides an idling current to prevent distortion from arising during the interval between the positive and negative amplification cycles, wherein the improvement comprises in combination therewith:

amplifier means connected to monitor the idle current and to provide a low impedance path on the output thereof;

comparator means connected to the amplifier for determining which half of the amplification cycle is occurring and providing a gating signal indicative thereof;

switching means connected to said amplifier means and said comparator means for receiving said gating signal and diverting current therethrough;

light source means connected to said switching means for producing and emitting light energy as a function of current flow therethrough;

a current source connected to said switching means and said light source means for providing current therefrom; and light receptor means optically connected to receive the light energy from the source means and further connected to the generating circuit thus forming a closed loop therebetween for automatically increasing or decreasing the idle current as a function of energy level.

7. An improved complementary direct-coupled amplifier of the type wherein a positive half of an input signal is amplified by a first set of component parts and a negative half of the input signal is amplified by a second set of similar component parts, both amplified halves being combined and connected to supply an output current, and wherein a generating circuit provides an idling current to prevent distortion from arising during the interval between the positive and negative amplification cycles, wherein the improvement comprises in combination therewith:

first electro-optic feedback means connected between the output and input of the amplifier for limiting the output current; and second electro-optic feedback means connected in a closed loop between the output of the amplifier and the generating circuit of the amplifier, and including comparator means connected to the amplifier for determining which half of the amplification cycle is occurring and for providing an inhibit signal indicative of output current flow, gated amplifier means connected to amplify the idle current and to prevent amplification simultaneously with the receiving of the inhibit signal, light source means connected to receive the amplified idle current from the gated amplifier means and provide light energy proportional thereto, and light receptor means optically connected to receive the light energy from the source means and for automatically increasing or decreasing the idle current as a function of energy level.

8. An improved complementary direct-coupled amplifier of the type wherein a positive half of an input signal is amplified by a first set of component parts and a negative half of the input signal is amplified by a second set of similar component parts, both amplified halves being combined and connected to supply an output current, and wherein a generating circuit provides an idling current to prevent distortion from arising during the interval between the positive and negative amplification cycles, wherein the improvement comprises in combination therewith:

first electro-optic feedback means connected between the output and input of the amplifier for limiting the output current; and second electro-optic feedback means connected in a closed loop between the output of the amplifier and the generating circuit of the amplifier, and including amplifier means connected to monitor the idle current and to provide a low impedance path on the output thereof, comparator means connected to the amplifier for determining which half of the amplification cycle is occurring and providing a gating signal indicative thereof, switching means connected to said amplifier means and said comparator means for receiving said gating signal and diverting current therethrough, light source means connected to said switching means for producing and emitting light energy as a function of current flow therethrough a current source connected to said switching means and said light source means for providing current therefrom, and light receptor means optically connected to receive the light energy from the source means and for automatically increasing or decreasing the idle current as a function of energy level.

9. An improved complementary direct-coupled amplifier of the type wherein a positive half of an input signal is amplified by a first set of component parts and a negative half of the input signal is amplified by a second set of similar component parts, both amplified halves being combined and connected to supply an output current, and wherein a generating circuit provides an idling current to prevent distortion from arising during the interval between the positive and negative amplification cycles, wherein the improvement comprises in combination therewith:

first electro-optic feedback means connected between the output and input of the amplifier, and including sensing means connected to monitor the output current and to produce and emit light energy proportional thereto, and photoconductor means optically adapted to receive the light energy from the sensing means and electrically connected to the input of the amplifier, for automatically adjusting the amplifier input bias as a function of energy level to prevent the output current from reaching current overload; and second electro-optic feedback means connected in a closed loop between the output of the amplifier and the generating circuit of the amplifier, and including comparator means connected to the amplifier for determining which half of the amplification cycle is occurring and for providing an inhibit signal indicative of output current flow, gated amplifier means connected to amplify the idle current and to prevent amplification simultaneously with the receiving of the inhibit signal, light source means connected to receive the amplified idle current from the gated amplifier means and provide light energy proportional thereto, and light receptor means optically connected to receive the light energy from the source means and for automatically increasing or decreasing the idle current as a function of energy level.

10. An improved complementary direct-coupled amplifier of the type wherein a positive half of an inut signal is amplified by a first set of component parts and a negative half of the input signal is amplified by a second set of similar component parts, both amplified halves being combined and connected to supply an output current, and wherein a generating circuit provides an idling current to prevent distortion from arising during the interval between the positive and negative amplification cycles, wherein the improvement comprises in combination therewith:

first electro-optic feedback means connected between the output and input of the amplifier, and including sensing means connected to monitor the output current and to produce and emit light energy proportional thereto, and photoconductor means optically adapted to receive the light energy from the sensing means and electrically connected to the input of the amplifier, for automatically adjusting the amplifier input bias as a function of energy level to prevent the output current from reaching current overload; and second electro-optic feedback means connected in a closed loop between the output of the amplifier and the generating circuit of the amplifier, and including amplifier means connected to monitor the idle current and to provide a low impedance path on the output thereof, comparator means connected to the amplifier for determining which half of the amplification cycle is occurring and for providing a gating signal indicative thereof, switching means connected to said amplifier means and said comparator means for receiving said gating signal and diverting current therethrough, light source means connected to said switching means for producing and emitting light energy as a function of current flow therethrough, a current source connected to said switching means and said light source means for providing current therefrom, and light receptor means optically connected to receive the light energy from the source means and for automatically increasing or decreasing the idle current as a function of energy level.

* * * * *